United States Patent
Noto et al.

(10) Patent No.: US 11,363,719 B2
(45) Date of Patent: Jun. 14, 2022

(54) WIRING SUBSTRATE AND COMPONENT BUILT-IN WIRING SUBSTRATE

(71) Applicant: IBIDEN CO., LTD., Gifu (JP)

(72) Inventors: Hiroyasu Noto, Ogaki (JP); Kentaro Wada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/184,761

(22) Filed: Feb. 25, 2021

(65) Prior Publication Data

US 2021/0282266 A1 Sep. 9, 2021

(30) Foreign Application Priority Data

Mar. 9, 2020 (JP) .............................. JP2020-040175

(51) Int. Cl.
*H05K 1/18* (2006.01)
*H05K 1/03* (2006.01)
*H05K 1/02* (2006.01)

(52) U.S. Cl.
CPC .......... *H05K 1/186* (2013.01); *H05K 1/0271* (2013.01); *H05K 1/0373* (2013.01); *H05K 2201/0191* (2013.01); *H05K 2201/0209* (2013.01); *H05K 2201/0269* (2013.01)

(58) Field of Classification Search
CPC ......... H05K 1/182–186; H05K 1/0271; H05K 2201/02–023; H05K 1/0353–0373
USPC ........................................................ 361/761
See application file for complete search history.

(56) References Cited

U.S. PATENT DOCUMENTS

| 2006/0237225 | A1* | 10/2006 | Kariya ............. | H01L 23/49827 174/262 |
| 2009/0175017 | A1* | 7/2009 | Kita ...................... | H01L 21/481 361/792 |
| 2009/0294027 | A1* | 12/2009 | Wang ..................... | H05K 1/183 156/60 |
| 2010/0320622 | A1* | 12/2010 | Machida ................. | H01L 24/83 257/E21.511 |
| 2012/0241205 | A1* | 9/2012 | Shimizu ................. | H01L 24/18 29/829 |

(Continued)

FOREIGN PATENT DOCUMENTS

JP 2016-039214 A 3/2016

*Primary Examiner* — Hoa C Nguyen
(74) *Attorney, Agent, or Firm* — Oblon, McClelland, Maier & Neustadt, L.L.P.

(57) ABSTRACT

A wiring substrate includes a core substrate, and a build-up part laminated on the substrate and including resin insulating layers. The insulating layers include a first insulating layer, the build-up part includes a conductor layer on the first insulating layer, a second insulating layer on the first insulating layer and covering the conductor layer, and a recess penetrating through the second insulating layer and exposing portion of the conductor layer such that the conductor layer includes component mounting region that places an electronic component in the recess and a conductor pad forming bottom surface of the recess, the insulating layers include inorganic filler such that all insulating layers or all insulating layers other than the first insulating layer include the inorganic filler and that inorganic filler content rate of the first insulating layer is lower than inorganic filler content rate of the insulating layers other than the first insulating layer.

20 Claims, 8 Drawing Sheets

(56) References Cited

U.S. PATENT DOCUMENTS

| | | | |
|---|---|---|---|
| 2014/0144686 A1* | 5/2014 | Shimizu | H05K 3/4602 |
| | | | 174/258 |
| 2015/0083476 A1* | 3/2015 | Kim | H05K 3/4644 |
| | | | 174/266 |
| 2018/0096940 A1* | 4/2018 | Kim | H01L 23/16 |
| 2019/0267327 A1* | 8/2019 | Aoki | H01L 24/20 |
| 2020/0161202 A1* | 5/2020 | Lee | H01L 23/3128 |
| 2020/0219816 A1* | 7/2020 | Aleksov | H01L 24/09 |

* cited by examiner

WIRING SUBSTRATE AND COMPONENT BUILT-IN WIRING SUBSTRATE

CROSS-REFERENCE TO RELATED APPLICATIONS

The present application is based upon and claims the benefit of priority to Japanese Patent Application No. 2020-040175, filed Mar. 9, 2020, the entire contents of which are incorporated herein by reference.

BACKGROUND OF THE INVENTION

Field of the Invention

The present invention relates to a wiring substrate and a component built-in wiring substrate.

Description of Background Art

Japanese Patent Application Laid-Open Publication No. 2016-39214 describes a build-up wiring board having a cavity for incorporating therein an electronic component. An entire bottom surface of the cavity is formed of a solid plain layer included in a conductor layer in a build-up layer. The entire contents of this publication are incorporated herein by reference.

SUMMARY OF THE INVENTION

According to one aspect of the present invention, a wiring substrate includes a core substrate, and a build-up part laminated on a surface of the core substrate and including resin insulating layers. The resin insulating layers include a first resin insulating layer, the build-up part includes a conductor layer formed on the first resin insulating layer, a second resin insulating layer laminated on the first resin insulating layer and covering the conductor layer, and a recess part penetrating through the second resin insulating layer and exposing a portion of the conductor layer such that the conductor layer includes a component mounting region that places an electronic component in the recess part and a conductor pad forming a bottom surface of the recess part, the resin insulating layers include inorganic filler such that all of the resin insulating layers or all of the resin insulating layers other than the first resin insulating layer include the inorganic filler and that an inorganic filler content rate of the first resin insulating layer is lower than an inorganic filler content rate of the resin insulating layers other than the first resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
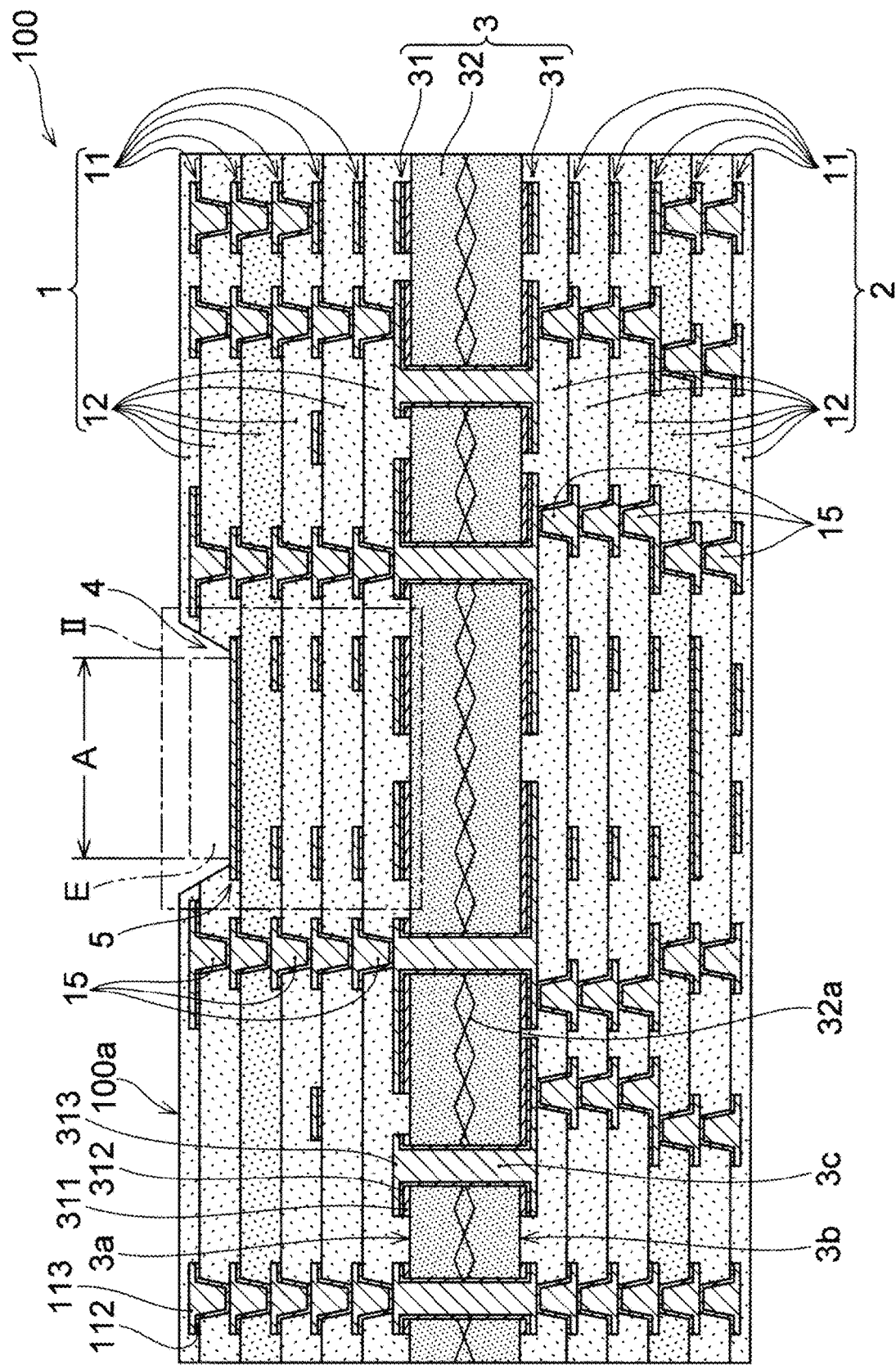
FIG. 1 is a cross-sectional view illustrating an example of a wiring substrate of an embodiment of the present invention.

Embodiments will now be described with reference to the accompanying drawings, wherein like reference numerals designate corresponding or identical elements throughout the various drawings.

Figure 2:
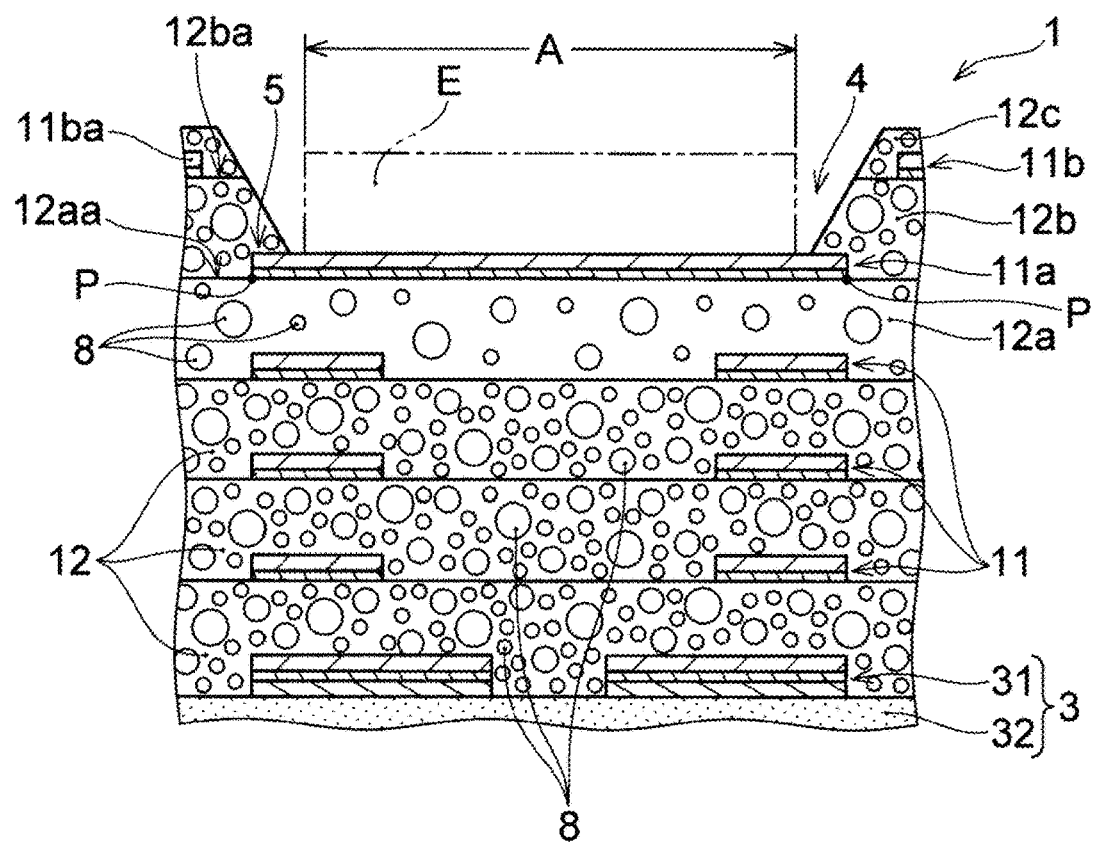
FIG. 2 is an enlarged view of a recess part and a lower-layer portion of the recess part of the wiring substrate of FIG. 1.

A wiring substrate according to an embodiment of the present invention is described with reference to the drawings. FIG. 1 is a cross-sectional view illustrating a wiring substrate 100 which is an example of the wiring substrate of the embodiment. FIG. 2 illustrates an enlarged view of a portion (II) of FIG. 1.

As illustrated in FIG. 1, the wiring substrate 100 includes a core substrate 3 having two main surfaces opposing each other in a thickness direction thereof (a first surface (3a) and a second surface (3b) on an opposite side with respect to the first surface (3a)), a first build-up part 1 laminated on the first surface (3a) of the core substrate 3, and a second build-up part 2 laminated on the second surface (3b) of the core substrate 3. The core substrate 3 includes a resin insulating layer 32 (core substrate insulating layer), and conductor layers 31 (core substrate conductor layers) that are respectively laminated on the first build-up part 1 side and the second build-up part 2 side of the resin insulating layer 32. The first surface (3a) is formed by an exposed surface of the conductor layer 31 on the first build-up part 1 side and an exposed portion of a surface of the resin insulating layer 32 on the first build-up part 1 side. The second surface (3b) is formed by an exposed surface of the conductor layer 31 on the second build-up part 2 side and an exposed portion of a surface of the resin insulating layer 32 on the second build-up part 2 side. The resin insulating layer 32 includes through-hole conductors (3c) that penetrate the resin insulating layer 32 and connect the conductor layer 31 on the first surface (3a) side and the conductor layer 31 on the second surface (3b) side to each other.

The first build-up part 1 and the second build-up part 2 each include multiple resin insulating layers 12 and multiple conductor layers 11. In each of the first and second build-up parts (1, 2), the multiple resin insulating layers 12 and the multiple conductor layers 11 are alternately laminated. In the wiring substrate 100 of FIG. 1, the first build-up part 1 includes five conductor layers 11 and six resin insulating layers 12. Similarly, the second build-up part 2 includes five conductor layers 11 and six resin insulating layers 12. The first build-up part 1 and the second build-up part 2 includes via conductors 15 that each penetrate a resin insulating layer 12 and connect to each other conductor layers 11 that adjacent to each other via the resin insulating layer 12.

In the description of each embodiment, a side farther from the resin insulating layer 32 in the thickness direction of the wiring substrate is also referred to as an "upper side" or simply "upper," and a side closer to the resin insulating layer 32 is also referred to as a "lower side" or simply "lower." Further, for the conductor layers and the resin insulating layers, a surface facing an opposite side with respect to the resin insulating layer 32 is also referred to as an "upper surface," and a surface facing the resin insulating layer 32 side is also referred to as a "lower surface." Therefore, for example, in the description of the first build-up part 1 and the second build-up part 2, a side farther from the core substrate 3 is also referred to as an "upper side," "upper-layer side," or simply "upper," and a side closer to the core substrate 3 is also referred to as a "lower side," "lower-layer side," or simply "lower."

The resin insulating layer 32 and the resin insulating layers 12 are each formed of any insulating resin. Examples of the insulating resin include an epoxy resin, a bismaleimide triazine resin (BT resin), a phenol resin, and the like. In the example of FIG. 1, the resin insulating layer 32 contains a core material (reinforcing material) (32a) formed of a glass fiber or an aramid fiber. Although not illustrated in FIG. 1, any one of the resin insulating layers 12 may contain a core material formed of a glass fiber or the like.

The resin insulating layers 32 and resin insulating layers 12 may each further contain inorganic filler. Examples of the inorganic filler contained in each of the resin insulating layers include fine particles formed of silica ($SiO_2$), alumina, or mullite. In the wiring substrate 100 of the example of FIG. 1, all the resin insulating layers 12 contain inorganic filler 8 (see FIG. 2). As will be described later, in the present embodiment, some resin insulating layers 12 (first resin insulating layers) have a lower inorganic filler content rate than the other resin insulating layers 12.

The conductor layers 31 and the conductor layers 11, as well as the through-hole conductors (3c) and the via conductors 15, are each formed using any metal such as copper or nickel. In the example of FIG. 1, the conductor layers 31 each include a metal foil 311, a metal film 312, and a plating film 313. The through-hole conductors (3c) are each formed of a metal film 312 and a plating film 313. Further, the conductor layers 11 and the via conductors 15 each include a metal film 112 and a plating film 113. Examples of the metal foil 311 include a copper foil and a nickel foil. The plating films (313, 113) are, for example, electrolytic plating films. The metal films (312, 112) are, for example, electroless plating films or sputtering films, and respectively function as power feeding layers when the plating films (313, 113) are formed by electrolytic plating.

The wiring substrate 100 of the present embodiment has a recess part 4. The recess part 4 is a portion of the wiring substrate 100 that is recessed from a surface (100a) (third surface) on the first build-up part 1 side toward a lower layer side (the core substrate 3 side). Therefore, the first build-up part 1 includes the recess part 4. The recess part 4 forms a cavity accommodating an electronic component (E) mounted on the wiring substrate 100. The recess part 4 includes a component mounting region (A) as a region where the electronic component (E) is to be placed.

The recess part 4 exposes, at a bottom surface thereof, a conductor pattern included in any one of the conductor layers 11 in the first build-up part 1. In the example of FIG. 1, the recess part 4 exposes a conductor pad 5 included in the second conductor layer 11 counting from the surface (100a) on the first build-up part 1 side.

In the following description, as illustrated in FIG. 2, the conductor layer (conductor layer 11) including the conductor pad 5 exposed at the bottom surface of the recess part 4 is also referred to as the first conductor layer (11a). Further, the resin insulating layer (resin insulating layer 12) immediately below the first conductor layer (11a) is also referred to as the first resin insulating layer (12a). The first conductor layer (11a) is formed on a surface (12aa) of the first resin insulating layer (12a) on an opposite side with respect to the core substrate 3. Further, the resin insulating layer (resin insulating layer 12) laminated on the surface (12aa) of the first resin insulating layer (12a) and on the first conductor layer (11a) is also referred to as the second resin insulating layer (12b). The first build-up part 1 includes at least the first resin insulating layer (12a), the first conductor layer (11a) and the second resin insulating layer (12b). The recess part 4 penetrates the second resin insulating layer (12b).

In the example of FIGS. 1 and 2, the first build-up part 1 also includes a conductor layer on a surface (12ba) of the second resin insulating layer (12b) on an opposite side with respect to the first conductor layer (11a). As illustrated in FIG. 2, the conductor layer on the surface (12ba) is also referred to as the second conductor layer (11b). The second conductor layer (11b) includes a predetermined conductor pattern (for example, a conductor pattern (11ba)). The conductor pattern of the second conductor layer (11b), such as the conductor pattern (11ba), and the recess part 4 are separated from each other in a plan view. That is, the recess part 4 is formed in a conductor layer on an upper-layer side of the first conductor layer (11a), such as the second conductor layer (11b), in a region where a conductor pattern is not provided in a plan view. The term "plan view" means viewing the wiring substrate 100 along its thickness direction.

In the example of FIGS. 1 and 2, the first build-up part 1 includes a resin insulating layer that covers the second resin insulating layer (12b) and the second conductor layer (11b). The resin insulating layer that covers the second resin insulating layer (12b) and the second conductor layer (11b) is also referred to as the third resin insulating layer (12c). The third resin insulating layer (12c) can function as a protective layer for the second conductor layer (11b). Since the third resin insulating layer (12c) has a function different from that of the other resin insulating layers 12 such as the first resin insulating layer (12a) which are interlayer resin insulating layers, the third resin insulating layer (12c) may be thinner than the other resin insulating layers 12 such as the first resin insulating layer (12a) and the second resin insulating layer (12b).

The recess part 4 also penetrates the third resin insulating layer (12c). That is, the recess part 4 penetrates at least the second resin insulating layer (12b). When a resin insulating layer (for example, the third resin insulating layer (12c)) is further formed on the second resin insulating layer (12b), the recess part 4 also penetrates the resin insulating layer on the second resin insulating layer (12b).

The recess part 4 exposes, at the bottom surface thereof, the conductor pad 5 which is a part of the first conductor layer (11a). The bottom surface of the recess part 4 is formed by the conductor pad 5. The conductor pad 5 is a so-called solid pattern extending in all directions along the surface (12aa) of the first resin insulating layer (12a). Or, the conductor pad 5 is a planar conductor pattern extending over an entire predetermined region. The conductor pad 5 occupies a predetermined region of the surface (12aa) of the first resin insulating layer (12a). The conductor pad 5 is formed so as to overlap in a plan view an entire region where the recess part 4 is provided in the wiring substrate 100 (specifically, a region occupied by the bottom surface of the recess part 4). Therefore, a region surrounded by a contour of the conductor pad 5 has an area equal to or larger than an area of the bottom surface of the recess part 4.

The conductor pad 5 includes the component mounting region (A) and functions as a mounting pad for stably mounting the electronic component (E) on the wiring substrate 100. The conductor pad 5 can also function as an electrode for setting a back surface of the electronic component (E) (a surface facing the conductor pad 5 when the electronic component (E) is mounted on the wiring substrate 100) to a predetermined potential.

In the wiring substrate 100, as illustrated in FIG. 2, all the multiple resin insulating layers 12 included in the first build-up part 1 contain the inorganic filler 8. The inorganic filler content rate of the first resin insulating layer (12a) is lower than the inorganic filler content rate of the resin insulating layers 12 other than the first resin insulating layer (12a) included in the first build-up part 1. For example, the inorganic filler content rate of the first resin insulating layer (12a) is lower than the inorganic filler content rate of the second and third resin insulating layers (12b, 12c). The inorganic filler content rate of the first resin insulating layer (12a) may be lower than the inorganic filler content rate of any one of the resin insulating layers 12 included in the first build-up part 1 and the resin insulating layers 12 included in the second build-up part 2. An advantage of that the inorganic filler content rate of the first resin insulating layer (12a) is lower than the inorganic filler content rate of the resin insulating layers 12 other than the first resin insulating layer (12a) is described below. The inorganic filler 8 illustrated in FIG. 2 and in FIGS. 3A, 3B and 5 referred to later is only conceptually illustrated, and these drawings are not intended to show specific shape, size and content rate of the inorganic filler 8.

As illustrated in FIG. 2, the conductor pad 5 extending over a predetermined region is provided on the surface (12aa) of the first resin insulating layer (12a). The electronic component (E) is mounted on the conductor pad 5 which includes the component mounting region (A). On the other hand, on a lower-layer side (opposite side with respect to the recess part 4 side) of the conductor pad 5, one or more resin insulating layers 12 such as the first resin insulating layer (12a) are provided, and the resin insulating layers 12 are each formed of an epoxy resin or the like. Therefore, it is thought that a stress is generated at an interface between the conductor pad 5 and the first resin insulating layer (12a) due to a difference in thermal expansion coefficient between the upper side and the lower side of the conductor pad 5. Such a stress is likely to concentrate near an edge (P) of the conductor pad 5, and therefore, a crack may occur in the first resin insulating layer (12a) starting from the edge (P).

On the other hand, regarding the resin such as an epoxy resin and the inorganic filler 8 among the materials forming the resin insulating layers 12 such as the first resin insulating layer (12a), in general, the resin such as epoxy resin has a higher elasticity or viscosity than the inorganic filler 8. Therefore, it is thought that a resin insulating layer 12 having a higher content rate of the resin such as an epoxy resin has a higher toughness than a resin insulating layer 12 having a lower content rate of the resin, and thus, has a higher resistance to a crack or the like.

In this regard, in the present embodiment, the first resin insulating layer (12a) has a lower inorganic filler content rate than the other resin insulating layers 12 included in the first build-up part 1. The first resin insulating layer (12a) preferably has a lower inorganic filler content rate than all the other resin insulating layers 12 included in the wiring substrate 100. That is, in the present embodiment, the first resin insulating layer (12a) can have a higher content rate of a resin material such as an epoxy resin than the other resin insulating layers 12 in the first build-up part 1 or in the wiring substrate 100. Therefore, even when the above-mentioned stress occurs at the interface between the first resin insulating layer (12a) and the conductor pad 5, it is thought that breaking or cracking is unlikely to occur in the first resin insulating layer (12a). Further, even when the stress is concentrated at the edge (P), it is thought that breaking or cracking is unlikely to occur.

On the other hand, the resin insulating layers 12 other than the first resin insulating layer (12a) may have a higher content rate of the inorganic filler 8 than the first resin insulating layer (12a). By having a higher content rate of the inorganic filler 8, the thermal expansion coefficient can be suitably adjusted, or heat dissipation performance can be improved. The resin insulating layers 12 other than the first resin insulating layer (12a) are completely not in contact with or are only slightly in contact with the conductor pad 5. Therefore, for the resin insulating layers 12 other than the first resin insulating layer (12a), it is possible that, rather than the above-described resistance to a crack, realization of an optimum thermal expansion coefficient or improvement in heat dissipation performance is demanded. In the present embodiment, only the first resin insulating layer (12a) has a relatively low inorganic filler content rate among the resin insulating layers 12 in the first build-up part 1 or in the wiring substrate 100. Therefore, for the resin insulating layers 12 other than the first resin insulating layer (12a), it is thought that an intended desirable property can be obtained by adding an inorganic filler.

In this way, according to the present embodiment, occurrence of breaking or cracking in the lower-layer resin insulating layer (the first resin insulating layer (12a)) of the component mounting cavity (recess part 4) of the wiring substrate 100 can be suppressed, and a desired property may be obtained for the other resin insulating layers 12.

The content rate of the inorganic filler 8 of the first resin insulating layer (12a) is, for example, 20% by mass or more and 45% by mass or less. On the other hand, the content rate of the inorganic filler 8 of the resin insulating layers 12 other than the first resin insulating layer (12a) in the wiring substrate 100 is, for example, 50% by mass or more and 75% by mass or less. Then, a difference between the content rate of the inorganic filler 8 of the first resin insulating layer (12a) and the content rate of the inorganic filler 8 of the resin insulating layers 12 other than the first resin insulating layer (12a) included in the first build-up part 1 (or the wiring substrate 100) is, for example, 5% by mass or more and 55% by mass or less. These exemplified inorganic filler content rates are particularly effective when the first resin insulating layer (12a) and the other resin insulating layers 12 each contain an epoxy resin and an inorganic filler 8 containing silica. When the first resin insulating layer (12a) and the other resin insulating layers 12 contain the organic filler 8 at the content rates in the above exemplified ranges, it is thought that both the effect of suppressing a crack or the like in the first resin insulating layer (12a) and the realization of a desired performance in the resin insulating layers 12 in the wiring substrate 100 can be achieved.

As described above, in the present embodiment, the first resin insulating layer (12a) has a lower inorganic filler content rate than the other resin insulating layers 12. Therefore, when the resin forming the first resin insulating layer (12a) and the resin forming the other resin insulating layers 12 such as the second resin insulating layer (12b) have the same thermal expansion coefficient, the thermal expansion coefficient of the first resin insulating layer (12a) can be different from the thermal expansion coefficient of the other resin insulating layers 12. In order to reduce such a difference in thermal expansion coefficient, the first resin insulating layer (12a) may contain a resin having a thermal expansion coefficient different from that of the resin forming the other resin insulating layers 12. For example, the thermal expansion coefficient of the resin forming the first resin insulating layer (12a) may be smaller than the thermal expansion coefficient of the resin forming the resin insulating layers 12 (for example, the second resin insulating layer (12b)) other than the first resin insulating layer (12a). When the thermal expansion coefficient of inorganic filler 8 is smaller than the thermal expansion coefficients of the resins forming the resin insulating layers 12 such as the first and second resin insulating layers (12a, 12b), it may be possible to reduce the difference between the thermal expansion coefficient of the first resin insulating layer (12a) and the thermal expansion coefficient of the other resin insulating layers 12.

In the present embodiment, it is also possible that the first resin insulating layer (12a) does not contain the inorganic filler 8. For example, it is possible that all the multiple resin insulating layers 12 included in the first build-up part 1 (or the wiring substrate 100) except for the first resin insulating layer (12a) contain the inorganic filler 8, and only the first resin insulating layer (12a) is formed without containing the inorganic filler 8. Also in this case, the inorganic filler content rate of the first resin insulating layer (12a) is lower than the inorganic filler content rate of the other resin insulating layers 12. That is, that "the inorganic filler content rate of the first resin insulating layer (12a) is lower than the inorganic filler content rate of the resin insulating layers 12 other than the first resin insulating layer (12a)" also includes that the first resin insulating layer (12a) is intentionally formed without containing an inorganic filler, and the resin insulating layers 12 other than the first resin insulating layer (12a) are intentionally formed containing an inorganic filler. When occurrence of a crack is of a particular concern, a first resin insulating layer (12a) that substantially does not contain the inorganic filler 8, that is, that is particularly highly resistant to occurrence of a crack, may be suitable.

FIG. 1 is referred to again, and the resin insulating layers 12 in the second build-up part 2 are described. Among the multiple resin insulating layers 12 included in the second build-up part 2, the fourth resin insulating layer 12 counting from the core substrate 3 side may have an inorganic filler content rate that is substantially the same as the inorganic filler content rate of the first resin insulating layer (12a). The fourth resin insulating layer 12 counting from the core substrate 3 in the second build-up part 2 (hereinafter, this resin insulating layer is also referred to as the "fifth resin insulating layer") has the same rank as the first resin insulating layer (12a) in the wiring substrate 100 of the example of FIG. 1 in terms of a rank relative to the core substrate 3. The term "rank" is a number assigned to each of the resin insulating layers 12 when the number that increases by 1 for each layer starting from the core substrate 3 side is sequentially assigned starting from 1 to each of the multiple resin insulating layers 12 laminated in each of the first build-up part 1 and the second build-up part 2.

When the fifth resin insulating layer having the same rank as the first resin insulating layer (12a) has substantially the same inorganic filler content rate as the first resin insulating layer (12a), it is thought that warpage is less likely to occur in the wiring substrate 100. Therefore, in the second build-up part 2, the resin insulating layer 12 (fifth resin insulating layer) having the same rank as the first resin insulating layer (12a) may have the lowest inorganic filler content rate among the multiple resin insulating layers 12 included in the second build-up part 2.

Figure 3A:
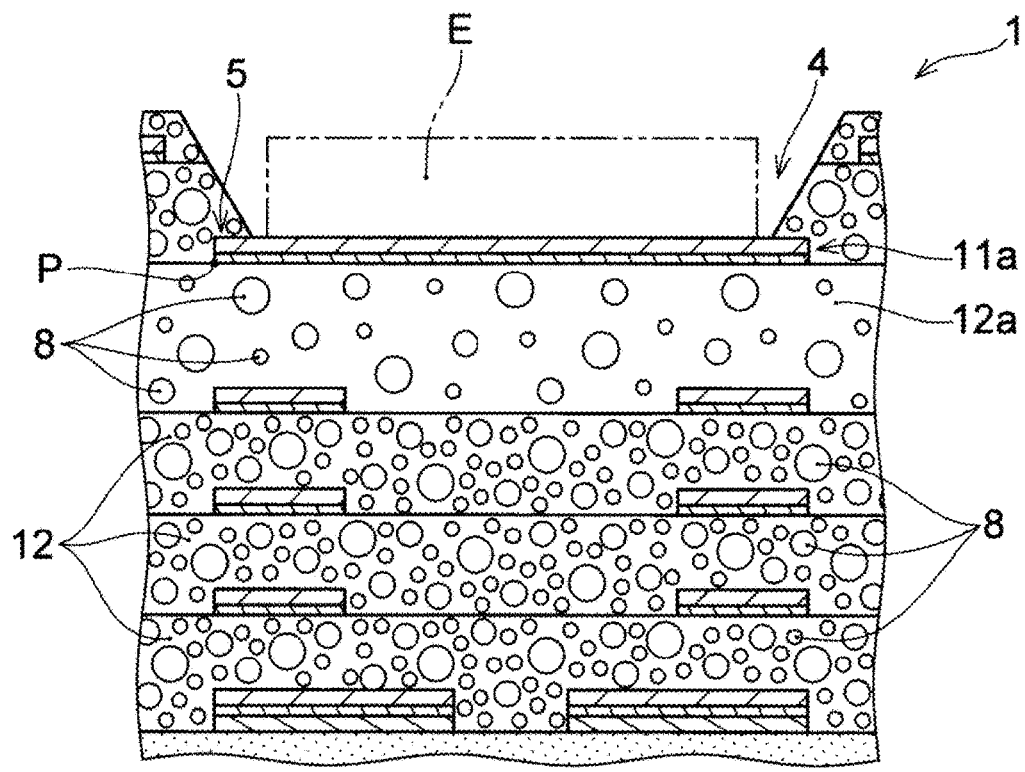
FIG. 3A is a cross-sectional view of the portion of FIG. 2 in a wiring substrate according to another embodiment of the present invention.
Figure 3B:
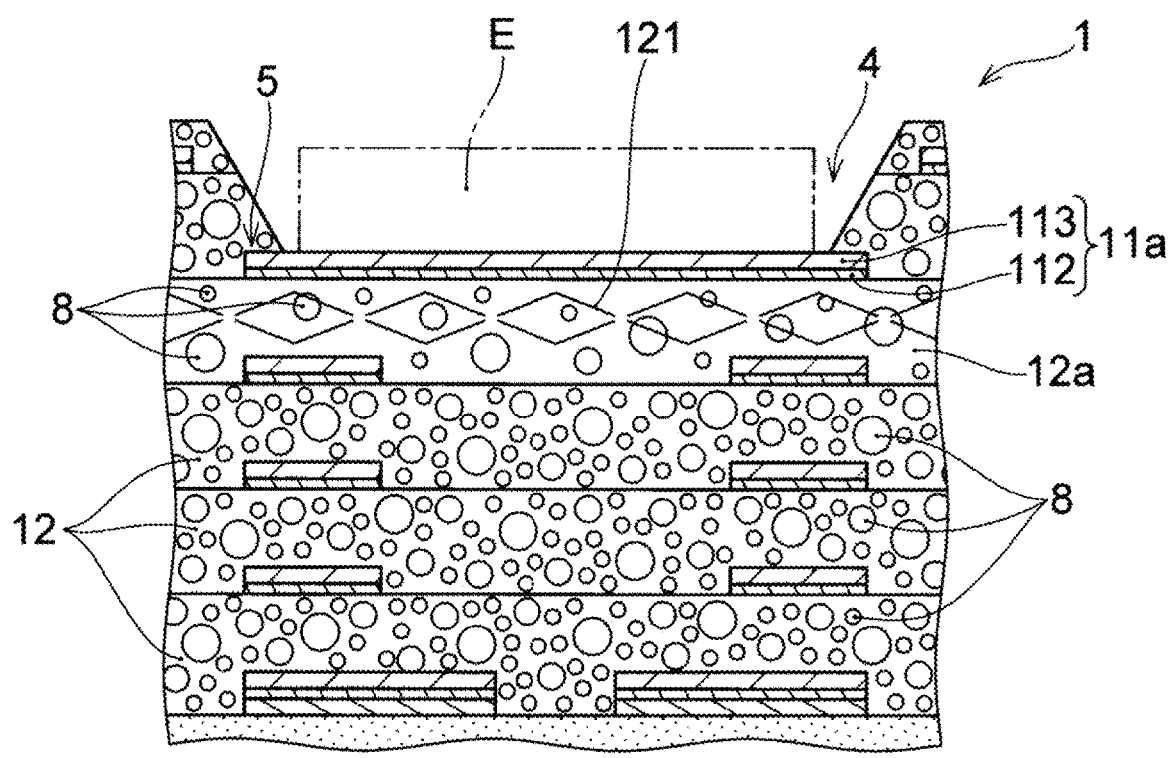
FIG. 3B is a cross-sectional view of the portion of FIG. 2 in a wiring substrate according to yet another embodiment of the present invention.

FIGS. 3A and 3B respectively illustrate modified embodiments of the wiring substrate 100 of FIG. 1. Similar to FIG. 2, FIGS. 3A and 3B each illustrate a recess part 4 and a portion on a lower-layer side of the recess part 4 in a modified embodiment. In FIGS. 3A and 3B, a structural element that is the same as a structural element illustrated in FIG. 2 is indicated using the same reference numeral symbol as the one used in FIG. 2, and a description thereof is omitted.

FIG. 3A illustrates an example in which the first resin insulating layer (12a) is thicker than the resin insulating layers 12 other than the first resin insulating layer (12a). The first resin insulating layer (12a) may have a lower inorganic filler content rate than the other resin insulating layers 12, and, as illustrated in FIG. 3A, may be thicker than the other resin insulating layers 12. In the example of FIG. 3A, since the first resin insulating layer (12a) is thicker than the other resin insulating layers 12, it is thought that the first resin insulating layer (12a) may have a higher mechanical strength than the other resin insulating layers 12. Further, even when a crack occurs starting from the edge (P) of the conductor pad 5, it is thought that it is difficult for the crack to extend in the thickness direction over the entire first resin insulating layer (12a) and it is difficult to cause a substantial defect. For example, the first resin insulating layer (12a) may be the thickest among the resin insulating layers 12 included in the first build-up part 1, or may be the thickest among the resin insulating layers 12 included in the wiring substrate 100.

FIG. 3B illustrates an example in which the first resin insulating layer (12a) contains a core material (reinforcing material) 121. It is thought that, when the first resin insulating layer (12a) contains the core material 121 as in the example of FIG. 3B, the first resin insulating layer (12a) is improved in mechanical strength. It is thought that, when the first resin insulating layer (12a) has a lower inorganic filler content rate than the other resin insulating layers 12 and contains the core material 121, breaking or cracking is even less likely to occur in the first resin insulating layer (12a). It is possible that, among the resin insulating layers 12 included in the first build-up part 1, only the first resin insulating layer (12a) contains the core material 121. Further, it is possible that, among the resin insulating layers 12 included in the wiring substrate 100, only the first resin insulating layer (12a) contains the core material 121.

Examples of the core material 121 include glass fibers, aramid fibers, and the like. These fibers forming the core material 121 can have a form of a woven fabric or a non-woven fabric. Further, it is also possible that these fibers forming the core material 121 are not in a form of a cloth, but are dispersed in the first resin insulating layer (12a) as individual fiber pieces (fiber chips) as in the example of FIG. 3B. Adhesion between the first resin insulating layer (12a) and the metal film 112 forming the first conductor layer (11a) may be high as compared to the case where the core material 121 is formed of fibers in a form of a cloth.

Figure 4:
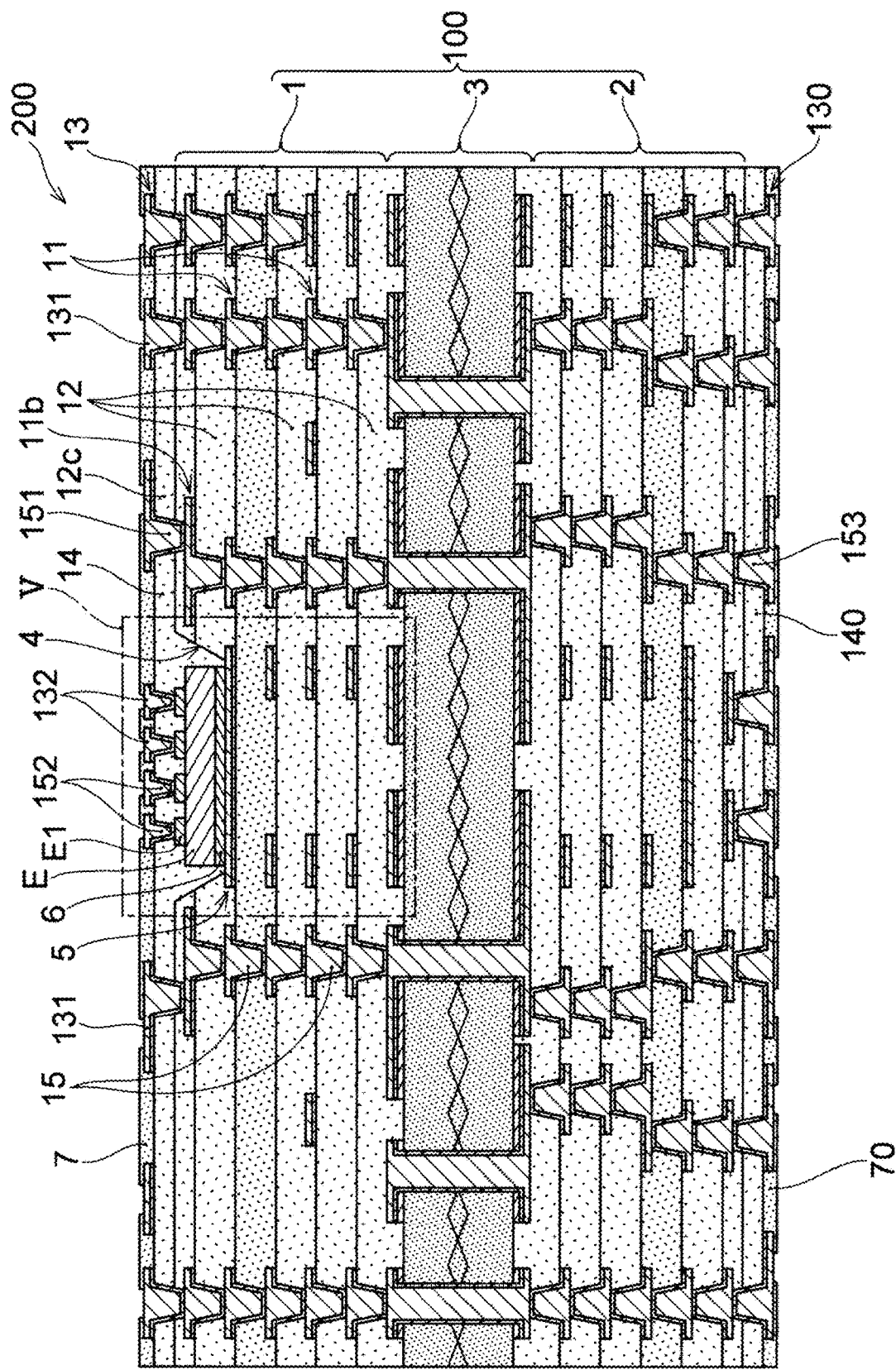
FIG. 4 is a cross-sectional view illustrating an example of a component built-in wiring substrate according to another embodiment of the present invention.
Figure 5:
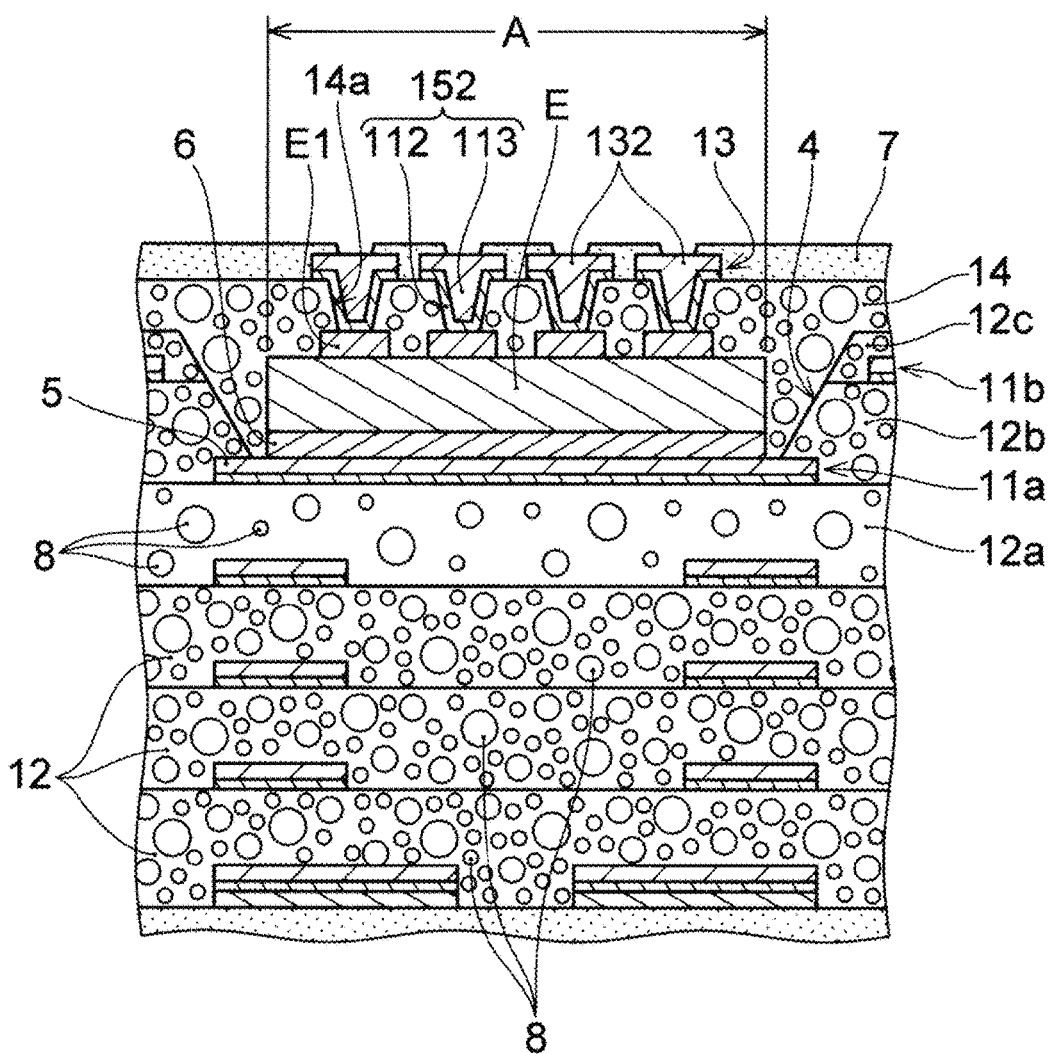
FIG. 5 is an enlarged view of an electronic component and a lower-layer portion of the electronic component in the component built-in wiring substrate of FIG. 4.

Next, with reference to FIGS. 4 and 5, a component built-in wiring substrate which is another embodiment of the present invention is described. FIG. 4 illustrates a cross-sectional view of a component built-in wiring substrate 200 which is an example of the other embodiment. FIG. 5 is an enlarged view of a portion (V) of FIG. 4.

As illustrated in FIG. 4, the component built-in wiring substrate 200 of the present embodiment includes the wiring substrate of the embodiment described above. The component built-in wiring substrate 200 in the example of FIG. 4 includes the wiring substrate 100 illustrated in FIG. 1. The component built-in wiring substrate 200 further includes an electronic component (E) and a fourth resin insulating layer 14 that seals the electronic component (E). The electronic component (E) is accommodated in the recess part 4 and is bonded to the conductor pad 5 using an adhesive 6. The recession part 4 is filled with a constituent material of the fourth resin insulating layer 14.

The electronic component (E) includes electrodes (E1) used for connecting the electronic component (E) to an external circuit. Examples of the electronic component (E) include active components such as semiconductor devices and passive components such as resistors. It is also possible that the electronic component (E) is a wiring material including fine wirings formed on a semiconductor substrate.

The component built-in wiring substrate 200 of FIG. 4 further includes a third conductor layer 13 formed on the fourth resin insulating layer 14, a solder resist layer 7 covering the fourth resin insulating layer 14 and the third conductor layer 13, and via conductors 151 and via conductors 152. The third conductor layer 13 includes connection pads (131, 132) used for connecting to external circuits. The solder resist layer 7 has openings that respectively expose the connection pads (131, 132). The via conductors 151 penetrate the fourth resin insulating layer 14 and the third resin insulating layer (12c) and connect the third conductor layer 13 and the second conductor layer (11b) to each other. The via conductors 152 penetrate the fourth resin insulating layer 14 on the electronic component (E) and connect the electrodes (E1) of the electronic component (E) to the third conductor layer 13.

A resin insulating layer 140, a conductor layer 130, a solder resist layer 70, and via conductors 153 are formed on a surface of the wiring substrate 100 on the second build-up part 2 side.

The fourth resin insulating layer 14 and the resin insulating layer 140 can be formed in the same manner as the resin insulating layers 12 using the same material as the resin insulating layers 12. The third conductor layer 13 and the conductor layer 130, and the via conductors (151-153) can be formed using the same materials as the conductor layers 11 and the via conductors 15, and can have the same structures as the conductor layers 11 and the via conductors 15. The solder resist layers (7, 70) are formed using any insulating material such as an epoxy resin or a polyimide resin.

As illustrated in FIG. 5, the electronic component (E) is mounted in the component mounting region (A) on the conductor pad 5. The fourth resin insulating layer 14 that seals the electronic component (E) in the recess part 4 is laminated on the second resin insulating layer (12b) on an opposite side with respect to the first conductor layer (11a). The via conductors 152 are formed in holes (14a) formed on the electrode (E1) in the fourth resin insulating layer 14. The via conductors 152 are integrally formed with the third conductor layer 13. The via conductors 152 are each formed to include, for example, a plating film 113 formed by electrolytic plating and a metal film 112 used as a power feeding layer when the plating film 113 is formed. Specifically, the via conductors 152 respectively connect the electrodes (E1) to the connection pads 132. The connection pads 132 may be each smaller than each of the connection pads 131 provided in a region that does not overlap with the recess part 4 in a plan view, and may be formed at a smaller pitch than the connection pads 131.

Any material can be used for the adhesive 6. Examples of the adhesive 6 include a conductive adhesive containing a metal such as solder, gold, or copper, or containing any conductive particles such as silver particles, and an insulating adhesive simply formed of an epoxy resin or the like.

The component built-in wiring substrate 200 of the present embodiment includes the wiring substrate of the embodiment exemplified as the wiring substrate 100 in FIG. 1. Therefore, the content rate of the inorganic filler 8 of the first resin insulating layer (12a) adjacent to the conductor pad 5 on the lower-layer side of the conductor pad 5 is lower than the content rate of the inorganic filler 8 of the resin insulating layers 12 other than the first resin insulating layer (12a) included in the first build-up part 1 (or the wiring substrate 100). Therefore, it is thought that, even in the component built-in wiring substrate 200, breaking or cracking is less likely to occur in the resin insulating layer (first resin insulating layer (12a)) adjacent to the bottom surface of the cavity (recess part 4) in which the electronic component (E) is positioned. That is, according to the present embodiment, it is thought that a component built-in wiring substrate that has few defects due to cracks in resin insulating layers and thus has a good quality is realized.

The first resin insulating layer (12a) may have an inorganic filler content rate lower than the inorganic filler content rate of each of the fourth resin insulating layer 14 and the resin insulating layer 140. That is, the fourth resin insulating layer 14 and the resin insulating layer 140 may each have a higher inorganic filler content rate than the first resin insulating layer (12a). It is thought that an intended desirable property can be obtained by adding the inorganic filler in the fourth resin insulating layer 14 and the resin insulating layer 140 while occurrence of a crack in the first resin insulating layer (12a) can be suppressed.

Further, as described above, among the resin insulating layers 12 included in the wiring substrate 100, the first resin insulating layer (12a) can be formed of a resin having a thermal expansion coefficient smaller than that of the resin forming the resin insulating layers 12 (for example, the second resin insulating layer (12b)) other than the first resin insulating layer (12a). Similar to this, the thermal expansion coefficient of the resin forming the first resin insulating layer (12a) may be smaller than the thermal expansion coefficient of the resin forming the fourth resin insulating layer 14. In particular, the fourth resin insulating layer 14, which can be contact with the second resin insulating layer (12b) in the recess part 4, may contain the same resin as the resin forming the second resin insulating layer (12b) and an inorganic filler, and may have substantially the same inorganic filler content rate as the second resin insulating layer (12b).

It is also possible that the component built-in wiring substrate 200 in the example of FIGS. 4 and 5 include not the wiring substrate 100 itself exemplified in FIG. 1, but any one of the modified embodiments exemplified in the description of the wiring substrate 100.

Next, a method for manufacturing the wiring substrate of the embodiment is described with reference to FIGS. 6A-6D, using the wiring substrate 100 of FIG. 1 as an example.

Figure 6A:
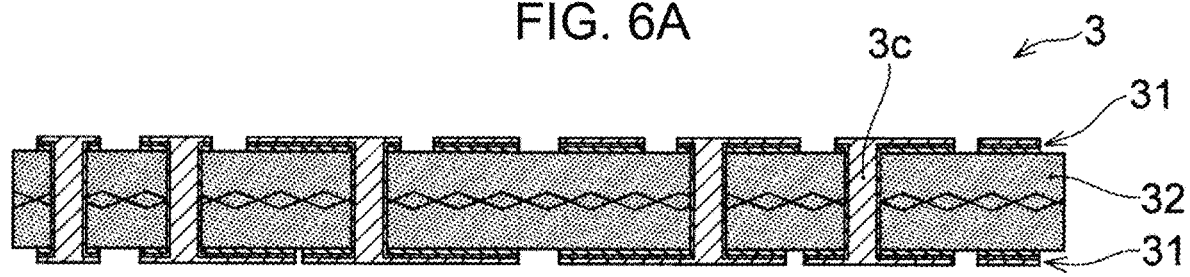
FIG. 6A is a cross-sectional view illustrating a manufacturing process of a wiring substrate according to an embodiment of the present invention.

As illustrated in FIG. 6A, a starting substrate (for example, a double-sided copper-clad laminated plate) including a resin insulating layer (to become the resin insulating layer 32 of the core substrate 3) and metal foils that are respectively laminated on both sides of the resin insulating layer is prepared, and the conductor layers 31 and the through-hole conductors (3c) of the core substrate 3 are formed. For example, through holes are formed at formation positions of the through-hole conductors (3c) by drilling or irradiation of $CO_2$ laser, and a metal film is formed in the through holes and on the metal foils by electroless plating or sputtering. Then, a plating film is formed by electrolytic plating using the metal film as a power feeding layer. As a result, the conductor layers 31 and the through-hole conductors (3c), each having a three-layer structure, are formed. After that, the core substrate 3 having predetermined conductor patterns is obtained by patterning the conductor layers 31 using a subtractive method.

Figure 6B:
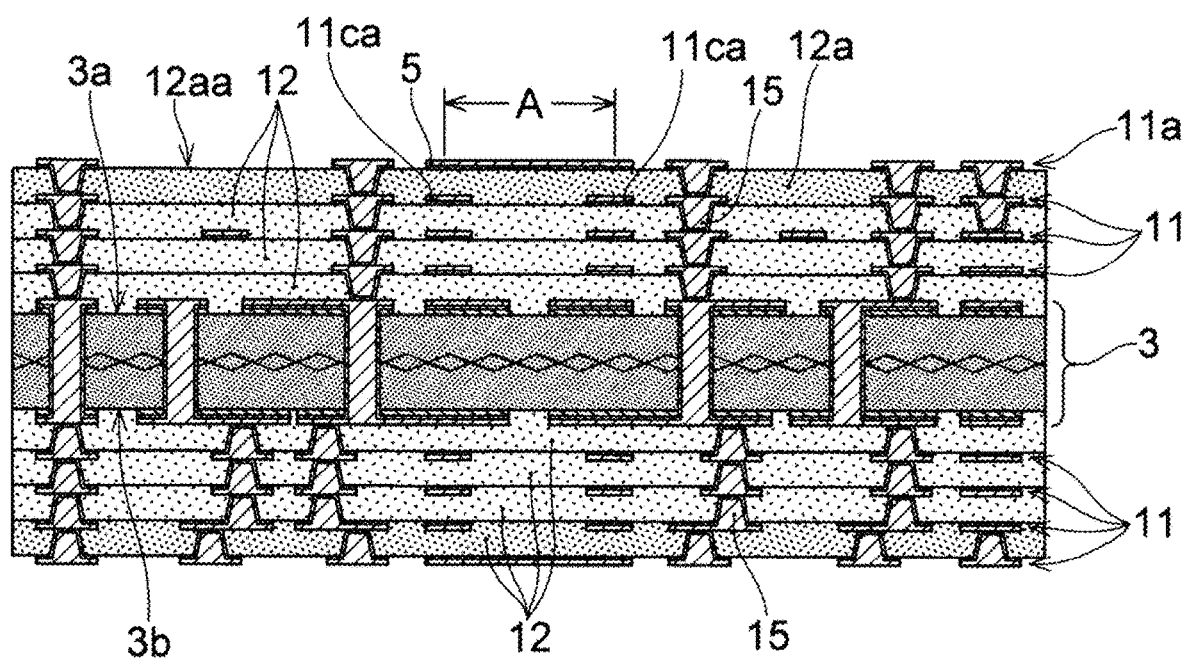
FIG. 6B is a cross-sectional view illustrating a manufacturing process of a wiring substrate according to the embodiment of the present invention.

As illustrated in FIG. 6B, the resin insulating layers 12 and the conductor layers 11 are alternately formed on the first surface (3a) of the core substrate 3. The resin insulating layers 12 and the conductor layers 11 are alternately formed on the second surface (3b) of the core substrate 3. In FIG. 6B, three resin insulating layers 12 and three conductor layers 11 are alternately formed on each of the first surface (3a) and the second surface (3b), and after that, a resin insulating layer (the first resin insulating layer (12a)) is further formed on the first surface (3a) side, and a resin insulating layer 12 is further formed on the second surface (3b) side. The first resin insulating layer (12a) is formed on the third resin insulating layer 12 and on the third conductor layer 11.

In the formation of each resin insulating layer 12 such as the first resin insulating layer (12a), for example, a film-like epoxy resin is laminated on the core substrate 3 or on a resin insulating layer 12 and a conductor layer 11 that are formed earlier, and is heated and pressed. As a result, the resin insulating layers 12 are formed. For the formation of each of the resin insulating layers 12 other than the first resin insulating layer (12a), for example, a film-like resin containing inorganic filler is used. For the formation of the first resin insulating layer (12a), for example, a film-like resin containing an inorganic filler at a lower content rate than the resin used for the formation of each of the resin insulating layers 12 other than the first resin insulating layer (12a) is used. It is also possible that a film-like resin that does not contain inorganic filler is used for the formation of the first resin insulating layer (12a). Through holes for forming the via conductors 15 are formed in the resin insulating layers 12, for example, by irradiation of $CO_2$ laser or the like.

A conductor layer (the first conductor layer (11a)) is further formed on the surface (12aa) of the first resin insulating layer (12a) (the surface on an opposite side with respect to the core substrate 3). A conductor layer 11 is further formed also on the outermost resin insulating layer 12 on the second surface (3b) side. The via conductors 15 are formed along with the formation of the conductor layers 11.

The conductor layers 11 such as the first conductor layer (11a) are each formed, for example, using a semi-additive method. That is, a metal film is formed by electroless plating or sputtering on an entire surface of a resin insulating layer 12 which is a base of a conductor layer 11 and in the through holes formed in the resin insulating layer 12. A plating film is formed by pattern plating including electrolytic plating using the metal film as a power feeding layer. The via conductors 15 are formed in the through holes formed in the resin insulating layer 12. After that, unwanted portions of the metal film are removed by, for example, etching or the like. As a result, the conductor layers 11 each having a two-layer structure including a predetermined conductor pattern are formed. The conductor layers 11 such as the first conductor layer (11a) are each formed using any metal such as copper or nickel.

The first conductor layer (11a) is formed so as to include the conductor pad 5 that extends over an entire predetermined region along the surface (12aa) of the first resin insulating layer (12a). That is, when the above-described pattern plating is performed, a plating resist having an opening in a region corresponding to a region where the conductor pad 5 is to be formed is used. The conductor pad 5 is formed in a region that includes a region (the component mounting region (A)) where an electronic component is to be placed in the wiring substrate 100 and that can form the entire bottom surface of the recess part 4 (see FIG. 6D). In a plan view, the conductor pad 5 is formed over an entire region including a region where the recess part 4 is to be formed.

Figure 6C:
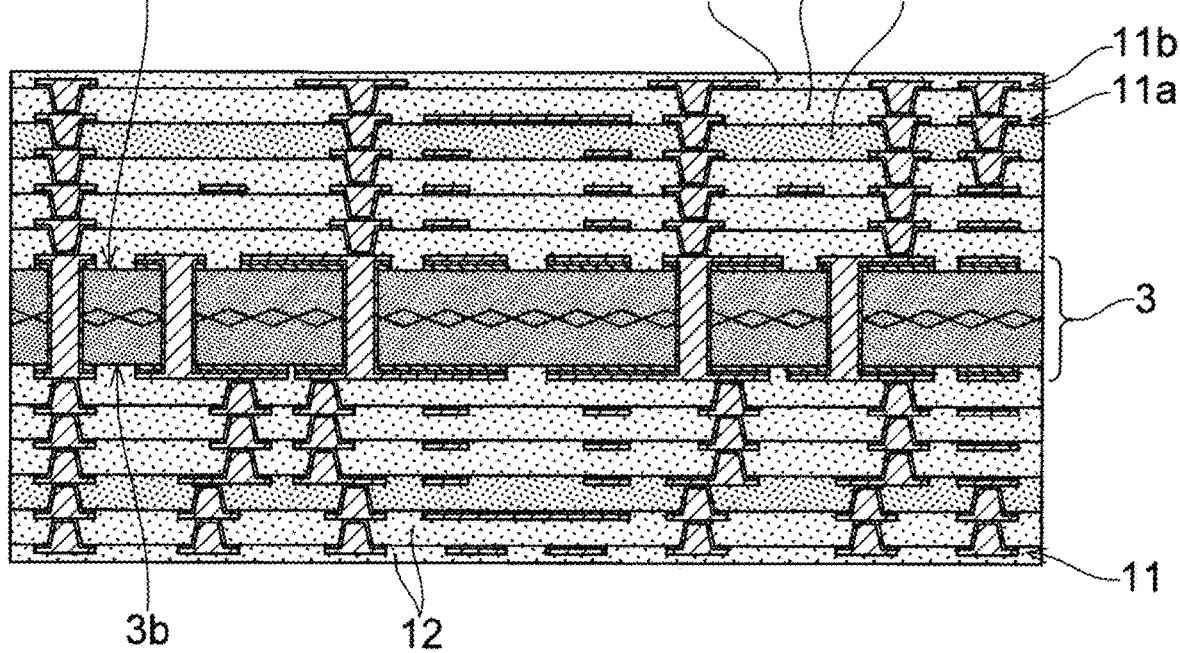
FIG. 6C is a cross-sectional view illustrating a manufacturing process of a wiring substrate according to the embodiment of the present invention.

As illustrated in FIG. 6C, the second resin insulating layer (12b) is formed on the first resin insulating layer (12a) and the first conductor layer (11a). In the example of FIG. 6C, the second conductor layer (11b) is further formed on the second resin insulating layer (12b), and the third resin insulating layer (12c) is formed on the second resin insulating layer (12b) and the second conductor layer (11b). Similarly, also on the second surface (3b) side, further from the state illustrated in FIG. 6B, two resin insulating layers 12 and a conductor layer 11 sandwiched between the two resin insulating layers 12 are formed.

The second and third resin insulating layers (12b, 12c), and the resin insulating layers 12 that are further formed on the second surface (3b) side, can be formed using the same method and the same material as the resin insulating layers 12 formed in the state of FIG. 6B. However, for the formation of each of the second and third resin insulating layers (12b, 12c), for example, a film-like resin containing an inorganic filler at a higher content rate than the resin used for the formation of the first resin insulating layers (12a) is used. A film-like resin containing inorganic filler at a higher content rate than the resin used for the formation of the first resin insulating layer (12a) may also be used for the formation of each of the resin insulating layers 12 on the second surface (3b) side. The second conductor layer (11b) and the conductor layer 11 that is further formed on the second surface (3b) side can be formed using the same method and the same material as the conductor layers 11 formed in the state of FIG. 6B.

Figure 6D:
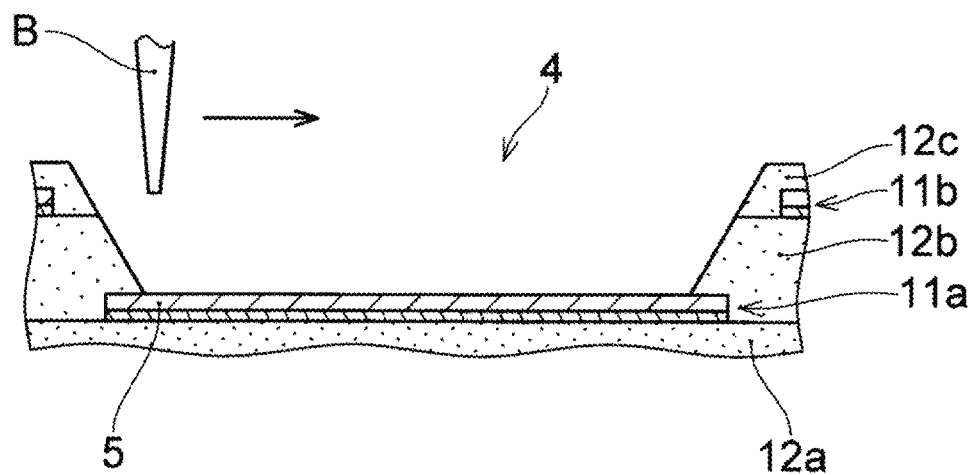
FIG. 6D is a cross-sectional view illustrating a manufacturing process of a wiring substrate according to the embodiment of the present invention.

As illustrated in FIG. 6D, the recess part 4 that penetrate the resin insulating layer (12b) and exposes a portion of the first conductor layer (11a), that is, the cavity that accommodates an electronic component, is formed. FIG. 6D illustrates an enlarged view of only the recess part 4 and a portion surrounding the recess part 4. The recess part 4 is formed, for example, by irradiating the laser beam (B) over the entire formation region of the recess part 4 from a surface on the first surface (3a) side of the core substrate 3 while performing pitch feeding. An example of the laser beam (B) is a $CO_2$ laser beam. The conductor pad 5 included in the first conductor layer (11a) is formed in an entire region including an entire formation region of the recess part 4 in a plan view. Therefore, the conductor pad 5 can function as a stopper of the laser beam (B) during the formation of the recess part 4.

The method for forming the recess part 4 is not limited to irradiation with the laser light beam (B). For example, it is also possible that the recess part 4 is formed by drilling. Further, the recess part 4 may be formed by forming a release film (not illustrated in the drawings) on the first conductor layer (11a) that is to become the bottom surface of the recess part 4 and removing the resin insulating layers (the second and third resin insulating layers (12b, 12c)) and the second conductor layer (11b) laminated on the release film. After the formation of the recess part 4, preferably, resin residues (smears) remaining in the recess part 4 are removed by a plasma treatment or a treatment using a chemical solution containing permanganate or the like (desmear treatment). Through the above processes, the wiring substrate 100 illustrated in FIG. 1 is completed.

When the modified embodiment of the wiring substrate 100 illustrated in FIG. 3A referenced above is manufactured, in the formation of the first resin insulating layer (12a), for example, a film-like resin thicker than the film-like resin used for the formation of the resin insulating layers 12 other than the first resin insulating layer (12a) is used. Further, when the modified embodiment of the wiring substrate 100 illustrated in FIG. 3B referenced above is manufactured, in the formation of the first resin insulating layer (12a), for example, a film-like resin containing a core material in a form of a cloth or in a form of fiber pieces is used.

Next, a method for manufacturing the component built-in wiring substrate of the other embodiment is described with reference to FIGS. 7A-7C, using the component built-in wiring substrate 200 of FIG. 4 as an example.

First, a wiring substrate having a cavity for mounting a component is prepared. For example, the wiring substrate 100 having the recess part 4 is prepared using the method for manufacturing a wiring substrate described with reference to FIGS. 6A-6D. FIG. 7A illustrates an enlarged view of the recess part 4 and a portion surrounding the recess part 4 of the prepared wiring substrate 100. Preferably, a surface of the conductor pad 5 exposed in the recess part 4 of the prepared wiring substrate 100 is roughened by a microetching process. Due to this roughening treatment, adhesion strength between the conductor pad 5 and the adhesive 6 provided on the conductor pad 5 is increased.

Figure 7A:
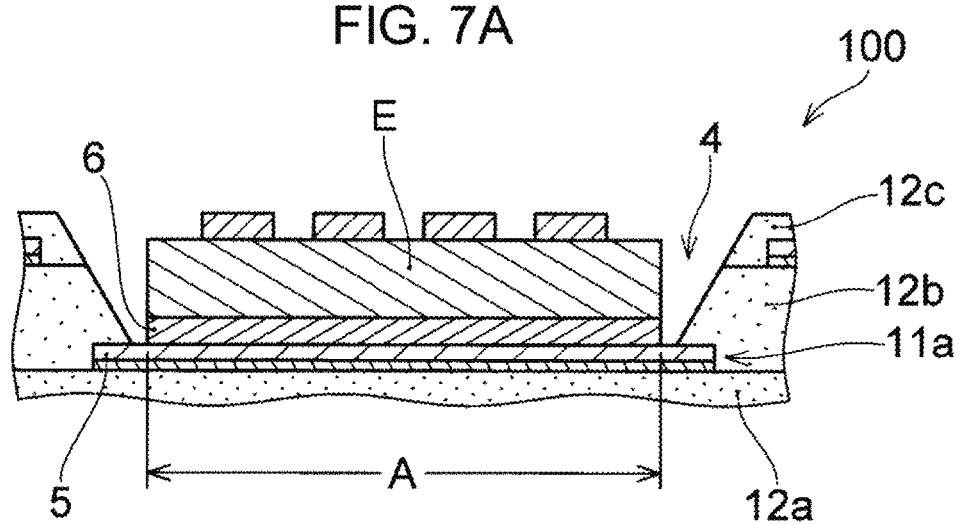
FIG. 7A is a cross-sectional view illustrating a manufacturing process of a component built-in wiring substrate according to another embodiment of the present invention.

As illustrated in FIG. 7A, the electronic component (E) is placed in the component mounting region (A) in the conductor pad 5 exposed in the recess part 4. For example, a metal pellet of solder, copper, or the like, or a conductive or insulating paste, is supplied onto the conductor pad 5 as the adhesive 6 using a mounter or dispenser, and further, the electronic component (E) is placed thereon using a die bonder or the like. As described above, the electronic component (E) is, for example, an active component such as a semiconductor device, a passive component such as a resistor, or a wiring material including fine wirings. The electronic component (E) and the adhesive 6 are, for example, heated and pressed on the conductor pad 5, and thereby, the adhesive 6 is cured, and the electronic component (E) is bonded to the conductor pad 5.

During the heating and pressing of the electronic component (E), a surrounding atmosphere may be depressurized, and air bubbles that have entered under the electronic component (E) when the electronic component (E) is placed may be removed. Further, after the electronic component (E) is mounted, in order to improve adhesion between the electronic component (E) and a sealing material that covers the electronic component (E), a surface of the electronic component (E) may be roughened by a micro-etching process.

Figure 7B:
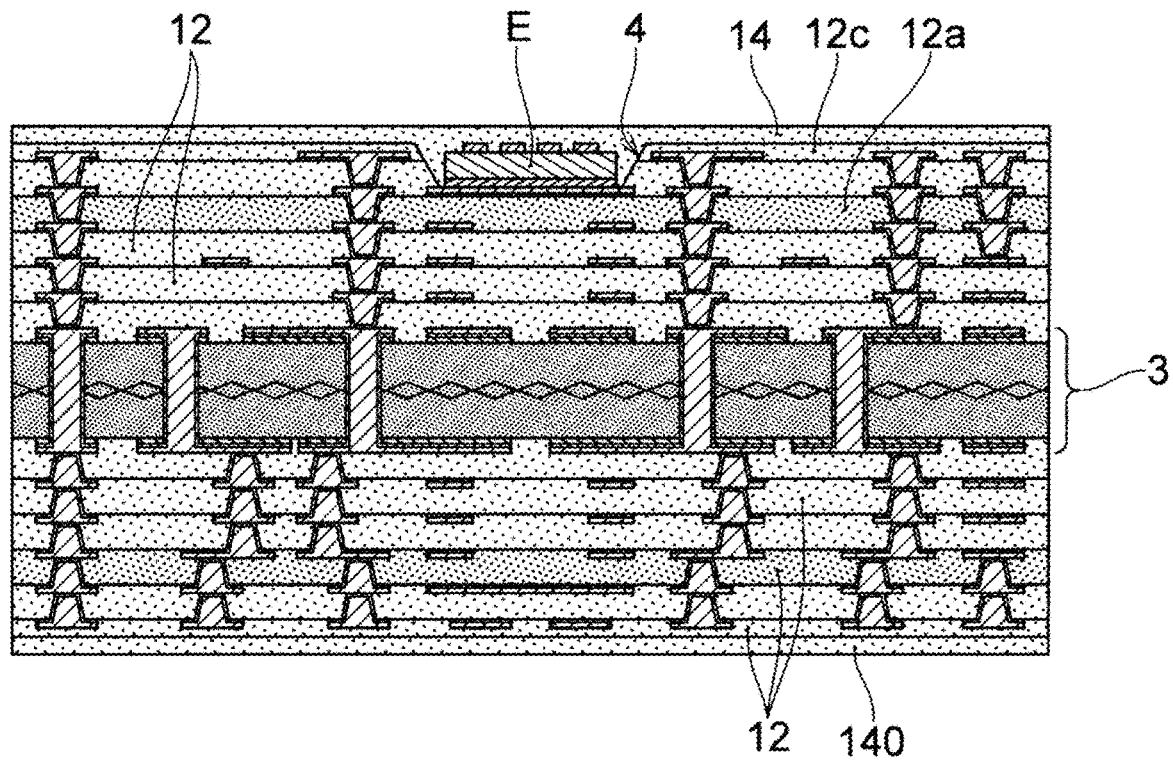
FIG. 7B is a cross-sectional view illustrating a manufacturing process of a component built-in wiring substrate according to the embodiment of the present invention.

As illustrated in FIG. 7B, the fourth resin insulating layer 14 covering the electronic component (E) is formed, and the recess part 4 is filled with the material of the fourth resin insulating layer 14. As a result, the electronic component (E) is sealed in the recess part 4. In the example of FIG. 7B, the fourth resin insulating layer 14 is formed on the third resin insulating layer (12c). The resin insulating layer 140 is also formed on the outermost resin insulating layer 12 on an opposite side with respect to the recess part 4 regarding the core substrate 3. Similar to the resin insulating layers 12 described above, the fourth resin insulating layer 14 and the resin insulating layer 140 can each be formed, for example, by laminating a film-like epoxy resin containing an inorganic filler at a content rate higher than the inorganic filler content rate of the first resin insulating layer (12a) and by applying heat and pressure thereto.

When the fourth resin insulating layer 14 is formed, for example, the film-like epoxy resin that is laminated in order to form the fourth resin insulating layer 14 is softened due to heating and pressing and flows into the recess part 4. Then, the recess part 4 is filled with the material, for example, the epoxy resin, forming the fourth resin insulating layer 14. Further, the electronic component (E) is sealed in the recess part 4 by the epoxy resin or the like forming the fourth resin insulating layer 14.

Figure 7C:
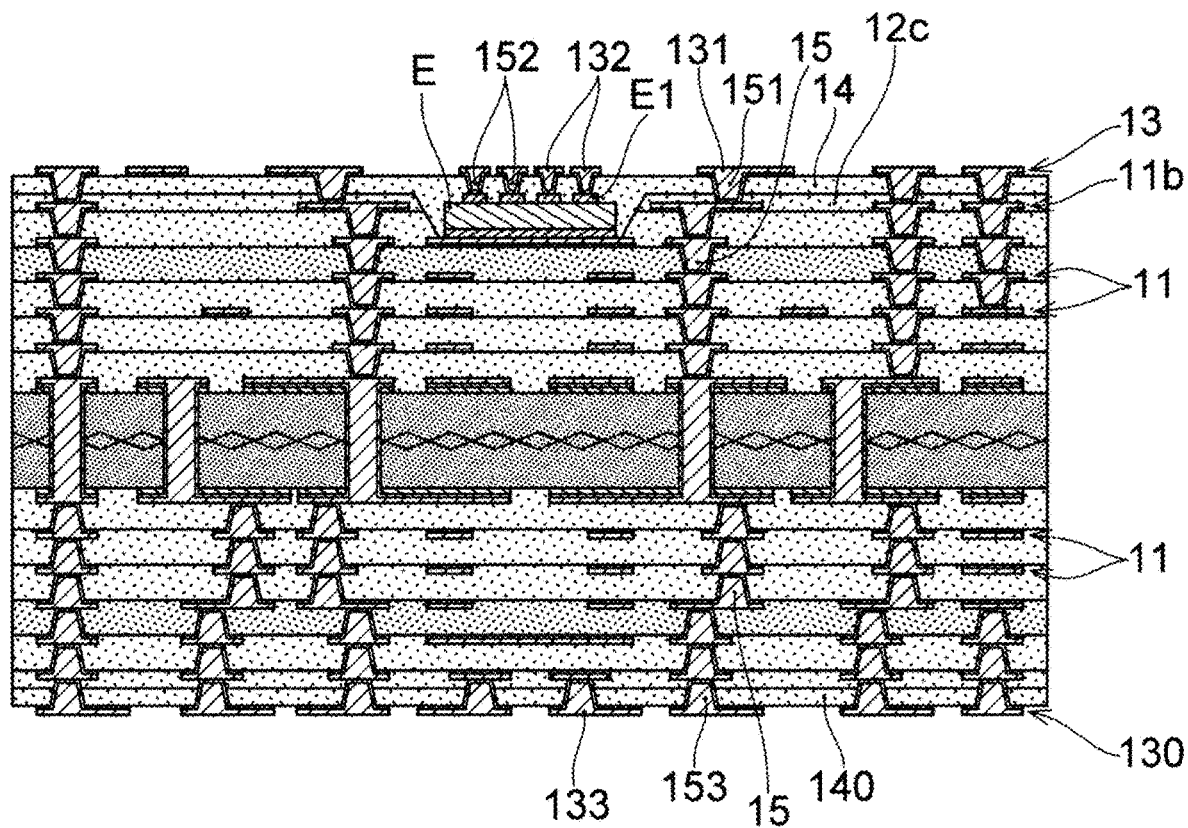
FIG. 7C is a cross-sectional view illustrating a manufacturing process of a component built-in wiring substrate according to the embodiment of the present invention.

As illustrated in FIG. 7C, the outer conductor layer (third conductor layer 13), and the via conductors 151 and the via conductors 152 are formed. The third conductor layer 13 is formed on the fourth resin insulating layer 14. Similarly, the conductor layer 130 is also formed on the resin insulating layer 140. Further, the via conductors 153 penetrating the resin insulating layer 140 are formed. The connection pads (131, 132) used for connecting to external circuits are provided in the third conductor layer 13. Connection pads 133 are also provided in the conductor layer 130. The third conductor layer 13 is connected to the second conductor layer (11b) by the via conductors 151 penetrating the fourth resin insulating layer 14 and the third resin insulating layer (12c). The connection pads 132 are connected to the electrodes (E1) of the electronic component (E) by the via conductors 152 penetrating the fourth resin insulating layer 14 on the electronic component (E).

The third conductor layer 13, the conductor layer 130, and the via conductors (151, 153) can be formed using the same method and the same material as the conductor layers 11 and the via conductors 15 described above. Regarding the formation of the via conductors 152, through holes exposing the electrodes (E1) of the electronic component (E) are formed by, for example, irradiating ultraviolet (UV) laser from the surface of the fourth resin insulating layer 14 toward the electrodes (E1). By filling the through holes with a plating film together with the formation of the third conductor layer 13, the via conductors 152 connecting the third conductor layer 13 (specifically, the connection pads 132) to the electrodes (E1) are formed.

After that, the solder resist layer 7 (see FIG. 4) is formed on the third conductor layer 13 and the fourth resin insulating layer 14, and the solder resist layer 70 (see FIG. 4) is formed on the conductor layer 130 and the resin insulating layer 140. Openings exposing the connection pads (131, 132) are provided in the solder resist layer 7, and openings exposing the connection pads 133 are provided in the solder resist layer 70. The solder resist layers (7, 70) and the openings of the solder resist layers are formed by forming resin layers each containing a photosensitive epoxy resin or polyimide resin, and performing exposure and development using masks having appropriate opening patterns.

A surface protective film (not illustrated in the drawings) formed of Au, Ni/Au, Ni/Pd/Au, solder, heat resistant preflux, or the like may be formed by electroless plating, solder leveling, spray coating, or the like on the connection pads (131-133) exposed from the openings of the solder resist layers (7, 70). Through the above processes, the component built-in wiring substrate 200 in the example of FIG. 4 is completed.

The wiring substrate and the component built-in wiring substrate of the embodiments are not limited to those having the structures illustrated in the drawings and those having the structures, shapes, and materials exemplified in the present specification. The wiring substrate of the embodiment can have the first-fourth resin insulating layers (12a-12c, 14) and the first-third conductor layers (11a, 11b, 13) in layers of any ranks relative to the core substrate 3 in the first build-up part 1. The wiring substrate and the component built-in wiring substrate of the embodiments can have any number of conductor layers and resin insulating layers.

In the wiring board having the cavity as described in Japanese Patent Application Laid-Open Publication No. 2016-39214, it is thought that there is a difference in thermal expansion coefficient between upper and lower sides of the bottom surface of the cavity. Therefore, a stress concentration site may occur around the cavity. As a result, a defect due to stress concentration may occur.

A wiring substrate according to an embodiment of the present invention includes: a core substrate that has a first surface and a second surface on an opposite side with respect to the first surface; a first build-up part that is laminated on the first surface and includes multiple resin insulating layers; and a second build-up part that is laminated on the second surface. The first build-up part includes: a first resin insulating layer; a first conductor layer that is formed on the first insulating layer; a second resin insulating layer that is laminated on the first resin insulating layer and the first conductor layer; and a recess part that penetrates the second resin insulating layer and exposes, at a bottom surface thereof, a portion of the first conductor layer. The first conductor layer includes a component mounting region where an electronic component is to be placed, and includes a conductor pad that forms the bottom surface of the recess part. All the multiple resin insulating layers included in the first build-up part, or all the multiple resin insulating layers other than the first resin insulating layer, each contain an inorganic filler. An inorganic filler content rate of the first resin insulating layer is lower than an inorganic filler content rate of the resin insulating layers other than the first resin insulating layer included in the first build-up part.

A component built-in wiring substrate according to an embodiment of the present invention includes: a wiring substrate according to an embodiment of the present invention; an electronic component placed in the component mounting region on the conductor pad; and a fourth resin insulating layer that is laminated on the second resin insulating layer on an opposite side with respect to the first conductor layer and seals the electronic component.

According to an embodiment of the present invention, a wiring substrate and a component built-in wiring substrate, in which a defect such as a crack in a lower-layer resin insulating layer of a component mounting cavity is unlikely to occur, can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
a core substrate; and
a build-up part laminated on a surface of the core substrate and comprising a plurality of resin insulating layers,
wherein the plurality of resin insulating layers includes a first resin insulating layer, the build-up part includes a conductor layer formed on the first resin insulating layer, a second resin insulating layer laminated on the first resin insulating layer and covering the conductor layer, and a recess part penetrating through the second resin insulating layer and exposing a portion of the conductor layer such that the conductor layer includes a component mounting region configured to place an electronic component in the recess part and a conductor pad forming a bottom surface of the recess part, the plurality of resin insulating layers includes inorganic filler such that all of the resin insulating layers or all of the resin insulating layers other than the first resin insulating layer include the inorganic filler and that an inorganic filler content rate of the first resin insulating layer is lower than an inorganic filler content rate of the resin insulating layers other than the first resin insulating layer.

2. The wiring substrate according to claim 1, wherein the build-up part is formed such that a difference between the inorganic filler content rate of the first resin insulating layer and the inorganic filler content rate of the resin insulating layers other than the first resin insulating layer is in a range of 5% by mass to 55% by mass.

3. The wiring substrate according to claim 2, wherein the build-up part is formed such that the first resin insulating layer has a largest thickness in the plurality of resin insulating layers.

4. The wiring substrate according to claim 1, wherein the build-up part is formed such that the first resin insulating layer has a largest thickness in the plurality of resin insulating layers.

5. The wiring substrate according to claim 1, wherein the build-up part is formed such that a thermal expansion coefficient of a resin forming the first resin insulating layer is smaller than a thermal expansion coefficient of a resin forming the second resin insulating layer.

6. The wiring substrate according to claim 1, wherein the build-up part is formed such that the first resin insulating layer includes a core material.

7. The wiring substrate according to claim 1, wherein the build-up part is formed such that all of the resin insulating layers other than the first resin insulating layer include the inorganic filler.

8. The wiring substrate according to claim 1, further comprising:
a second build-up part laminated on a second surface of the core substrate on an opposite side with respect to the surface and comprising a plurality of resin insulating layers such that the plurality of resin insulating layers in the second build-up part includes a resin insulating layer positioned at a rank equal to a rank of the first resin insulating layer from the core substrate and having a lowest inorganic filler content rate in the plurality of resin insulating layers in the second build-up part.

9. The wiring substrate according to claim 1, wherein the build-up part is formed such that the build-up part includes a second conductor layer having a conductor pattern on a surface of the second resin insulating layer on an opposite side with respect to the conductor layer, and that the recess part is separated from the conductor pattern of the second conductor layer.

10. The wiring substrate according to claim 9, wherein the plurality of resin insulating layer in the build-up part includes a third resin insulating layer covering the second resin insulating layer and the second conductor layer, and the build-up part is formed such that the recess part is penetrating through the third resin insulating layer and that the third resin insulating layer is thinner than the first resin insulating layer and the second resin insulating layer.

11. A component built-in wiring substrate, comprising:
the wiring substrate of claim 1;
an electronic component placed in the component mounting region on the conductor pad; and
a fourth resin insulating layer laminated on the second resin insulating layer on an opposite side with respect to the conductor layer such that the fourth resin insulating layer is sealing the electronic component.

12. The wiring substrate according to claim 1, further comprising:
a second build-up part laminated on a second surface of the core substrate on an opposite side with respect to the surface.

13. The wiring substrate according to claim 12, wherein the build-up part is formed such that a difference between the inorganic filler content rate of the first resin insulating layer and the inorganic filler content rate of the resin insulating layers other than the first resin insulating layer is in a range of 5% by mass to 55% by mass.

14. The wiring substrate according to claim 12, wherein the build-up part is formed such that the first resin insulating layer has a largest thickness in the plurality of resin insulating layers.

15. The wiring substrate according to claim 12, wherein the build-up part is formed such that a thermal expansion coefficient of a resin forming the first resin insulating layer is smaller than a thermal expansion coefficient of a resin forming the second resin insulating layer.

16. The wiring substrate according to claim 12, wherein the build-up part is formed such that the first resin insulating layer includes a core material.

17. The wiring substrate according to claim 12, wherein the build-up part is formed such that all of the resin insulating layers other than the first resin insulating layer include the inorganic filler.

18. The wiring substrate according to claim 12, wherein the build-up part is formed such that the build-up part includes a second conductor layer having a conductor pattern on a surface of the second resin insulating layer on an opposite side with respect to the conductor layer, and that the recess part is separated from the conductor pattern of the second conductor layer.

19. The wiring substrate according to claim 18, wherein the plurality of resin insulating layer in the build-up part includes a third resin insulating layer covering the second resin insulating layer and the second conductor layer, and the build-up part is formed such that the recess part is penetrating through the third resin insulating layer and that the third resin insulating layer is thinner than the first resin insulating layer and the second resin insulating layer.

20. A component built-in wiring substrate, comprising:
the wiring substrate of claim 12;
an electronic component placed in the component mounting region on the conductor pad; and
a fourth resin insulating layer laminated on the second resin insulating layer on an opposite side with respect to the conductor layer such that the fourth resin insulating layer is sealing the electronic component.

* * * * *